(12) United States Patent
Brophy

(10) Patent No.: US 6,637,017 B1
(45) Date of Patent: *Oct. 21, 2003

(54) REAL TIME PROGRAMMABLE FEATURE CONTROL FOR PROGRAMMABLE LOGIC DEVICES

(75) Inventor: Brenor Brophy, San Jose, CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/527,715

(22) Filed: Mar. 17, 2000

(51) Int. Cl.[7] .............................................. G06F 17/50
(52) U.S. Cl. ............................... 716/16; 716/17; 716/1; 326/39
(58) Field of Search ............................ 716/12, 16–17, 716/1–2; 326/37–41

(56) References Cited

U.S. PATENT DOCUMENTS

| | | | |
|---|---|---|---|
| 5,128,871 A | * 7/1992 | Schmitz | 716/17 |
| 5,521,529 A | * 5/1996 | Agrawal et al. | 326/38 |
| 5,587,921 A | * 12/1996 | Agrawal et al. | 716/16 |
| 5,610,829 A | * 3/1997 | Trimberger | 716/16 |
| 5,757,207 A | * 5/1998 | Lytle et al. | 326/39 |
| 5,949,710 A | * 9/1999 | Pass et al. | 365/185.05 |
| 6,005,377 A | * 12/1999 | Chen et al. | 323/283 |
| 6,020,757 A | * 2/2000 | Jenkins, IV | 326/39 |
| 6,038,386 A | * 3/2000 | Jain | 715/16 |
| 6,086,629 A | * 7/2000 | McGettigan et al. | 716/12 |
| 6,128,770 A | * 10/2000 | Agrawal et al. | 716/17 |
| 6,229,336 B1 | * 5/2001 | Felton et al. | 326/38 |
| 6,278,290 B1 | * 8/2001 | Young | 326/41 |

* cited by examiner

*Primary Examiner*—Vuthe Siek
*Assistant Examiner*—Paul Dinh
(74) *Attorney, Agent, or Firm*—Christopher P. Maiorana, P.C.

(57) ABSTRACT

An apparatus comprising a first circuit and a second circuit. The first circuit may be configured to generate a plurality of signals in response to one or more input signals. The second circuit may be configured to generate one or more control signals in response to said plurality of signals. The one or more control signals may control one or more non-logic features.

24 Claims, 3 Drawing Sheets

REAL TIME PROGRAMMABLE FEATURE CONTROL FOR PROGRAMMABLE LOGIC DEVICES

FIELD OF THE INVENTION

The present invention relates to a method and/or architecture of a programmable logic device generally and, more particularly, to real time programmable control of features in a programmable logic device (PLD).

BACKGROUND OF THE INVENTION

A programmable logic device (PLD) allows programmable logic to be implemented in an integrated circuit. Conventional PLDs have configuration bits that select low power, slew rate, and I/O drive standards. The configuration bits are programmed when a design is created. The configuration bits (and thus the features controlled by the configuration bits) cannot be changed while the device is operating (i.e., in real time). If the feature selections need to be changed, the conventional programmable logic device must be reprogrammed.

The use of configuration bits requires that feature settings be determined at the time the PLD design is compiled and programmed. Because the configuration bits are fixed, the design of a PLD can require compromises. For example, a low-power feature may be desirable for a majority of the time a PLD is operating. However, if one particular set of operations requires a faster high-power mode, the conventional PLD design will be unable to take advantage of the low-power feature.

Inherently low power PLDs such as the "Cool-Runner" family from Xilinx (formally from Philips) use a full CMOS implementation for the product term array eliminating the need for sense-amps that burn DC power. The inherently low power devices can use more die area than similar sense-amp based devices. Although the inherently low power devices can provide a solution for achieving the lowest power budget using a CPLD, the advantage is limited purely to power and can incur a die size/cost penalty depending on the technology used.

Some operations of the conventional PLDs are real time programmable. PLD vendors offer dedicated product terms for real time control of logical operations of macrocells and I/O buffers. For example, conventional PLDs offer reset (RPT), preset (SPT) and clock product terms (PTCLK) that can control a macrocell logic operation in real time. PLDs also provide dedicated OE product terms to control a tri-state level of output buffers in real time. However, real time control capability of other non-logic features is not available. For example, Lattice PLDs allow programming analog characteristics, but not in real time. SRAM based PLDs require setting configuration bits at the time of programming. Despite the lack of real time programmability, non-logic features are becoming more common in PLD devices.

SUMMARY OF THE INVENTION

The present invention concerns an apparatus comprising a first circuit and a second circuit. The first circuit may be configured to generate a first plurality of signals in response to one or more input signals. The second circuit may be configured to generate one or more control signals in response to said first plurality of signals. The one or more control signals may control one or more non-logic features.

The objects, features and advantages of the present invention include providing a method and/or architecture for real time programmable control of non-logic features in a programmable logic device that may: (i) dynamically change a configuration of any feature implemented on the device, (ii) control a low or zero power mode on sense-amp based programmable logic devices, (iii) dynamically control non-logic features of the device, (iv) control non-logic features of the device using dedicated product terms, (v) control power consumption of logic blocks independently, (vi) control features such as I/O slew rate and drive characteristics in real time, and/or (vii) allow logic implemented in one logic block to control features in other logic blocks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
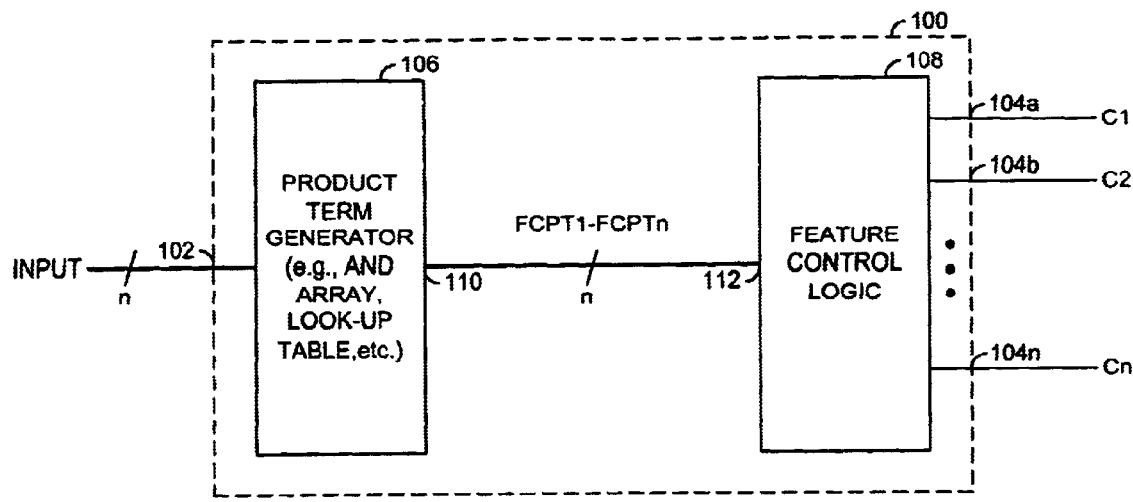
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as part of a logic block in a programmable logic device. The circuit 100 may have an input 102 that may receive an input signal (e.g., INPUT) and a number of outputs 104a–104n that may present a number of signals (e.g., C1–Cn). The signal INPUT may, in one example, be N-bits wide, where N is an integer. The signal INPUT may be generated, in one example, by an interconnect matrix (IM) or a programmable interconnect matrix (PIM) in response to external signals and/or signals from one or more macrocells (e.g., a state machine). The signals C1–Cn may be used, in one example, as control signals. The signals C1–Cn may control, in one example, non-logic features of a programmable logic device normally controlled by configuration bits. When the circuit 100 is implemented as part of a logic block, the signals C1–Cn may control non-logic features of the logic block containing the circuit 100 and/or other logic blocks.

The circuit 100 may comprise, in one example, a circuit 106 and a circuit 108. The circuit 106 may be implemented, in one example, as a product term generator. In one example, the circuit 106 may comprise a product term array (e.g., an AND array) or a look-up-table (LUT). The circuit 108 may be implemented, in one example, as a feature control logic circuit. The signal INPUT may be presented to an input of the circuit 106. The circuit 106 may have an output 110 that may present a number of signals (e.g., FCPT1–FCPTn) to an input 112 of the circuit 108. The circuit 106 may be configured to generate the signals FCPT1–FCPTn in response to one or more bits of the signal INPUT. The signals FCPT1–FCPTn may be, in one example, dedicated product terms. The product terms may be similar to the RPT, SPT, PTCLK and/or OEPT product terms. However, the outputs may be used to control logic implementing various non-logic features of, in one example, a logic block.

The circuit 108 may be configured to generate the signals C1–Cn in response to one or more of the signals FCPT1–FCPTn. The circuit 108 may generate the signals C1–Cn as, in one example, a logical combination of the signals FCPT1–FCPTn. The circuit 108 generally comprises custom designed logic for dynamically controlling the non-logic features in accord with predetermined design criteria of a particular application.

Figure 2:
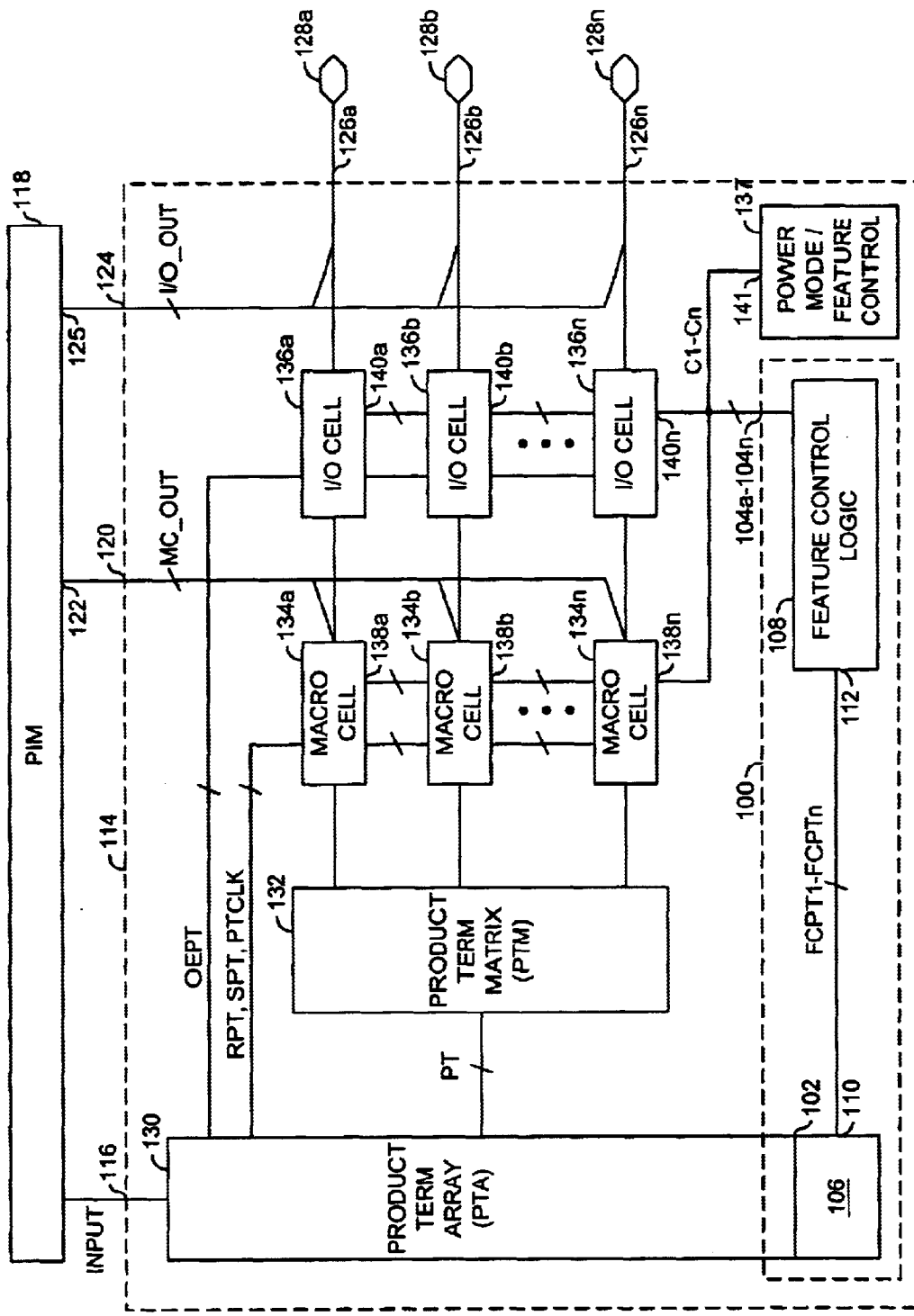
FIG. 2 is a detailed block diagram illustrating an application of the circuit of FIG. 1.

Referring to FIG. 2, a detailed block diagram illustrating an application of the circuit 100 is shown. The circuit 100 is shown implemented in the context of a logic block 114. The logic block 114 may have an input 116 that may receive the signal INPUT from a PIM 118, an output 120 that may present a signal (e.g., MC_OUT) to an input 122 of the PIM 118, an output 124 that may present a signal (e.g., IO_IN) to an input 125 of the PIM 118 and a number of input/outputs 126a–126n that may connect to a number of I/O pins 128a–128n.

The logic block 114 may comprise a product term array 130, a product term matrix 132, a number of macrocells 134a–134n, a number of I/O cells 136a–136n and a power control block (or circuit) 137. However, other configurations of logic blocks may be implemented to meet the design criteria of a particular application. For example, the I/O cells 136a–136n may be implemented separately from the logic block 114. Such an implementation may be found in co-pending application U.S. Ser. No. 09/475,879 which is hereby incorporated by reference in its entirety. The circuit 106 may be implemented, in one example, as a portion of the product term array 130. One or more of the signals C1–Cn may be presented to inputs 138a–138n of the macrocells 134a–134n, inputs 140a–140n of the I/O cells 136a–136n and an input 141 of the power control block 137, respectively. The inputs 138a–138n and 140a–140n may be n-bits wide, where n is an integer.

The macrocells 134a–134n and the I/O cells 136a–136n may be configured, in one example, to alter non-logic features in response to the signals C1–Cn. The non-logic features may include, but are not limited to, a power-down feature, a power-up feature, a low-power feature, slew-rate control, I/O drive characteristics, a sleep mode, and any other feature presently controlled or controllable by configuration bits.

The present invention may provide control of various non-logic features of a programmable logic device in real time. The features may have previously only been controllable by reconfiguring the device. For example:

a user may trigger a low power or ultra low power (sleep) mode during run time based on the result of any logic programmed into the device or the state of any input pin;

a user may control the power consumption of logic blocks independently such that logic in some logic blocks may be used to control the power of others;

a user may control other features such as I/O slew rate or I/O drive standards in real time; and/or a user may implement logic in one logic block to control features in other logic blocks.

The present invention generally extends the idea of dedicated product terms used for logical control of macrocells and output buffers to other non-logic related features such as power, slew rate and I/O drive characteristics. These features may have been available, but were never controllable in real time.

The circuit 100 may be used to control any particular feature that may be implemented. Specifically some features (only some of which are currently offered) may be: (i) Low power mode The sense-amps are slowed down to burn less power, (ii) Power-down/up mode—The logic block would be put into and out of a zero power mode, (iii) I/O slew rate—The I/O buffer slew rate could be changed to reduce noise, (iv) I/O drive characteristics—The I/O current and voltage characteristic could be changed. Other features for which real time control may be desirable may include phase delays and switching spread spectrum on/off.

The present invention allows a user to control non-logic features in real time using logic the user has designed and implemented. The user generally determines during the design phase how particular features may be used dynamically. For example, placing some or a majority of the logic blocks in a sleep mode when their functionality is not required. The user may define logic that switches a feature on or off. The design software may implement the logic in, in one example, a feature-control portion of a product term array or logic block. During normal device operation when the feature control product term is evaluated as true, the feature may be activated or deactivated.

Some other examples of how this invention could be used are as follows:

A user knows they will wish to switch a large number of I/O simultaneously. The user would like to use the slow slew rate feature to reduce the noise that would be generated. However, at other times the user needs the faster speed of the standard slew rate. With the present invention, the user may define logic to detect a set of conditions just prior to the switching event. The logic implemented may then dynamically change the slew rate to the slow setting for just that event, while using the faster rate at all other times.

A user may select a PLD to drive a number of different devices on a bus. However, some devices may require a TTL level input while others require a CMOS level input. The user may define logic to dynamically change the I/O buffer drive characteristics depending on the device being driven.

A user may wish to limit the power used by a design because of concern for the maximum junction temperature of the device. The user may decide to use a low-power feature which slows the product term sense amplifiers (and so slow the device) to reduce power. However, at certain times the user may require the full speed of the high-power mode. By using the present invention, the user may define a default mode of the low-power mode except for the specific instances when the high-power speed is really needed.

The essential advantage provided by the present invention may be the ability to dynamically change the utilization of any feature implemented on, in one example, a programmable logic device. A secondary advantage may be the ability to control a low or zero power mode on sense-amp based programmable logic devices.

Figure 3:
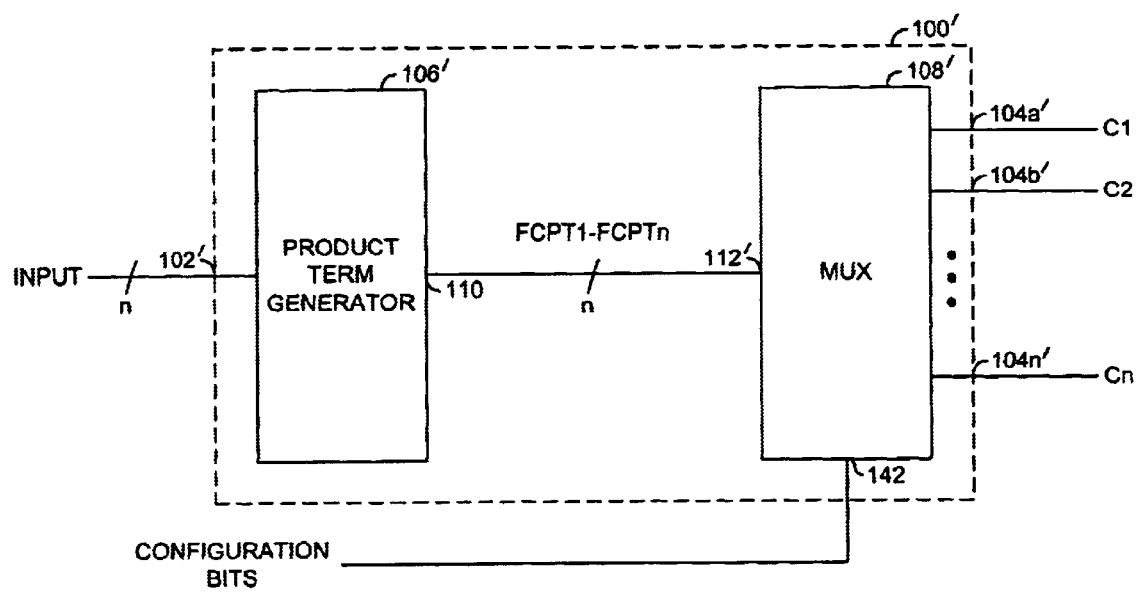
FIG. 3 is a block diagram illustrating an alternative embodiment of the present invention.

Referring to FIG. 3, a circuit 100' illustrating an alternative embodiment is shown. The circuit 100' may comprise a circuit 108'. The circuit 108' may be implemented, in one example, as a multiplexer circuit. The circuit 108' may have an input 142 that may receive a number of configuration bits. The circuit 108' may be configured, in one example, to selected a number of the configuration bits as the signals C1–Cn in response to the signals FCPT1–FCPTn. However, the multiplexer 108' may provide less flexibility for controlling the non-logic features than the circuit 108. The circuit 108' may increase the number of product terms required for a particular level of control. The circuit 106' may be configured to have some product terms that may be selected as either configuration or logic rather than dedicated to configuration.

Figure 4:
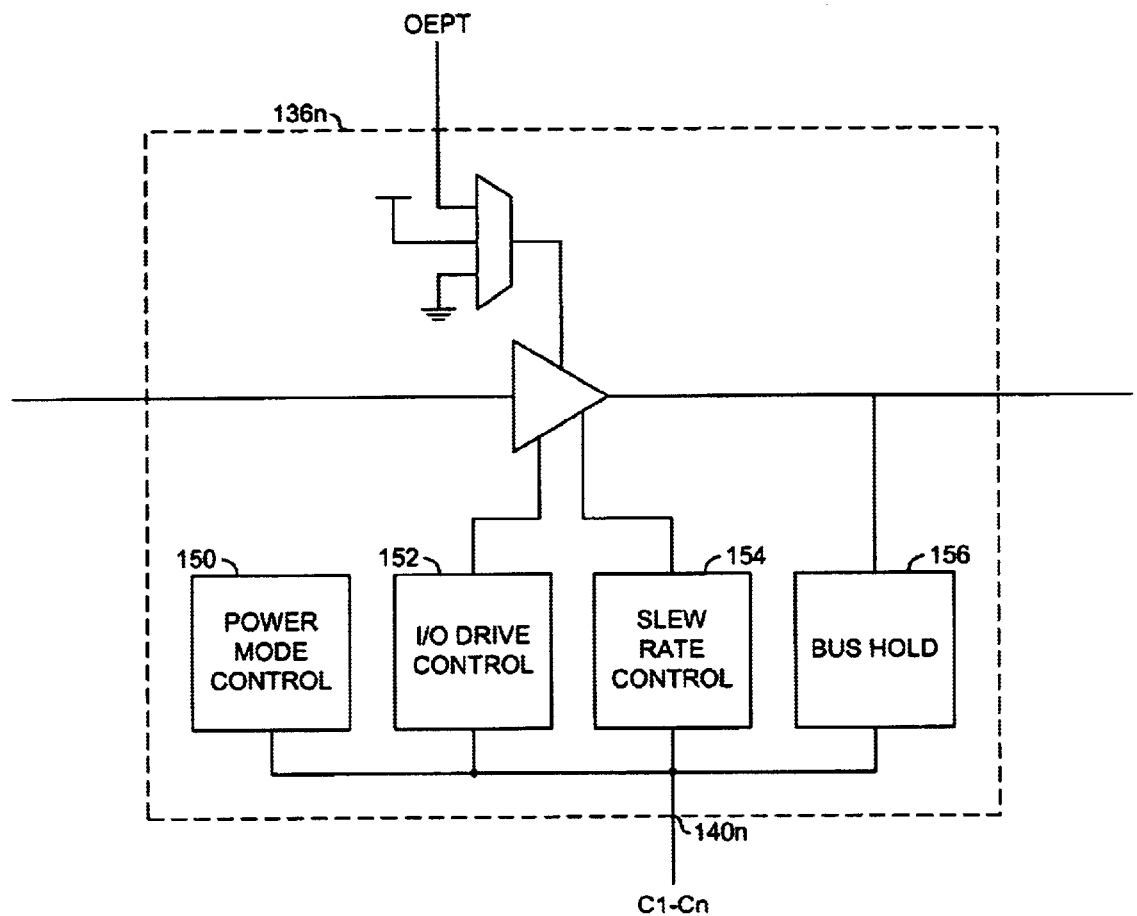
FIG. 4 is a detailed block diagram illustrating non-logic features of an I/O cell of FIG. 2.

Referring to FIG. 4, a detailed block diagram is shown illustrating non-logic features of the I/O cells 136a–136n of FIG. 2. The I/O cells 136a–136n may be configured, in one example, to alter non-logic features in response to the signals C1–Cn. The non-logic features may include, but are not limited to, power control 150, slew-rate control 152, I/O drive characteristics 154, bus hold 156, and any other feature presently controlled or controllable by configuration bits. The power control feature may comprise a power-down feature, a power-up feature, a low-power feature, and a sleep mode.

The increasing number of portable applications may drive a requirement for low power. The present invention may meet the requirement with existing sense-amp based PLD architecture. In addition, the programmable control of non-logic features may support the number of I/O related standards and options that have produced a very feature rich PLD architecture. The real time programmable control of non-logic features may provide a more useful programmable logic device.

While the invention has been particularly shown and described with reference to the preferred embodiments thereof, it will be understood by those skilled in the art that various changes in form and details may be made without departing from the spirit and scope of the invention.

What is claimed is:

1. An integrated circuit comprising:
   a first circuit configured to generate one or more dedicated feature control product terms for real time control of non-logic features of said integrated circuit in response to one or more input signals; and
   a second circuit configured to dynamically control one or more of said non-logic features of said integrated circuit in response to said one or more dedicated feature control product terms.

2. The integrated circuit according to claim 1, wherein said first and second circuits comprise part of a first logic block of a programmable logic device.

3. The integrated circuit according to claim 2, wherein said programmable logic device further comprises one or more second logic blocks coupled to said first logic block.

4. The programmable logic device according to claim 3, wherein said one or more dedicated feature control product terms are generated in response to one or more outputs from said one or more second logic blocks and control one or more non-logic features in said first logic block.

5. The integrated circuit according to claim 1, wherein said first circuit comprises a product term array configured to generate said one or more dedicated feature control product terms.

6. The integrated circuit according to claim 1, wherein said first circuit comprises a look-up table configured to generate said one or more dedicated feature control product terms.

7. The integrated circuit according to claim 1, wherein said second circuit is configured to dynamically control a power-down feature of said integrated circuit.

8. The integrated circuit according to claim 1, wherein said second circuit is configured to place a logic block in one of a low power, zero power and standby condition in response to said one or more dedicated feature control product terms.

9. The integrated circuit according to claim 1, wherein said second circuit is configured to dynamically control a power-up feature of said integrated circuit.

10. The integrated circuit according to claim 1, wherein said second circuit is configured to dynamically switch a logic block between (i) any of a low power, zero power and standby mode and (ii) a high-power mode in response to said one or more dedicated feature control product terms.

11. The integrated circuit according to claim 1, wherein said second circuit is configured to dynamically control a speed of said integrated circuit.

12. The integrated circuit according to claim 1, wherein said second circuit is configured to dynamically control a speed of a logic block of said integrated circuit in response to said one or more dedicated feature control product terms.

13. The integrated circuit according to claim 1, wherein said second circuit is configured to dynamically control an input/output slew rate of one or more input/outputs of said integrated circuit in response to said one or more dedicated feature control product terms.

14. The integrated circuit according to claim 1, wherein said second circuit is configured to dynamically control an input/output drive characteristic of one or more input/outputs of said integrated circuit in response to said one or more dedicated feature control product terms.

15. The integrated circuit according to claim 14, wherein said input/output drive characteristic is controlled to meet a predetermined I/O standard.

16. The integrated circuit according to claim 1, wherein said one or more dedicated feature control product terms are generated in response to a logical combination of one or more external input signals and one or more output signals from one or more macrocells of said programmable logic device.

17. The integrated circuit according to claim 1, wherein said first circuit is further configured to generate one or more of a reset, a preset, an output enable and a clock product terms dedicated to real time control of logic operations of said integrated circuit.

18. The integrated circuit according to claim 1, further comprising:
   one or more macrocells;
   one or more I/O cells comprising said one or more non-logic features; and
   an interconnect matrix coupling said first circuit, said one or more macrocells and said one or more I/O cells.

19. The integrated circuit according to claim 1, wherein said second circuit is configured to control power consumption of said integrated circuit by dynamically changing a speed of one or more product term sense amplifiers of said integrated circuit in response to said one or more dedicated feature control product terms.

20. The integrated circuit according to claim 1, wherein said second circuit is configured to generate one or more control signals in response to a logical combination of said plurality of dedicated feature control product terms and said one or more control signals are presented as one or more configuration bits of said integrated circuit.

21. A programmable logic device comprising:
   means for generating one or more dedicated feature control product terms for real time control of non-logic features of said programmable logic device in response to one or more input signals; and
   means for generating one or more control signals in response to said one or more dedicated feature control product terms, wherein said one or more control signals dynamically control one or more of said non-logic features of said programmable logic device.

22. A method for providing real time programmable control of non-logic features in a programmable logic device comprising the steps of:

(A) generating a plurality of dedicated feature control product terms for real time control of said non-logic features in response to a plurality of input signals; and (B) dynamically controlling one or more of said non-logic features in said programmable logic device in response to said plurality of dedicated feature control product terms.

23. The method according to claim 22, wherein step (B) further comprises:

changing a slew-rate of a plurality of input/outputs of said programmable logic device to a first setting via said one or more dedicated feature control product terms prior to a predetermined event; and changing said slew-rate of said plurality of input/outputs to a second setting via said one or more dedicated feature control product terms following said predetermined event.

24. The method according to claim 23, wherein said first setting comprises one of a slow setting and a fast setting and said second setting comprises the other of said fast and slow settings.

* * * * *